United States Patent
Wood

(10) Patent No.: US 8,258,006 B2
(45) Date of Patent: Sep. 4, 2012

(54) METHOD FOR FABRICATING STACKED SEMICONDUCTOR COMPONENTS

(75) Inventor: Alan G. Wood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 270 days.

(21) Appl. No.: 12/265,032

(22) Filed: Nov. 5, 2008

(65) Prior Publication Data

US 2009/0068791 A1 Mar. 12, 2009

Related U.S. Application Data

(62) Division of application No. 11/167,367, filed on Jun. 27, 2005, now Pat. No. 7,589,406.

(51) Int. Cl.
- H01L 21/44 (2006.01)
- H01L 21/48 (2006.01)
- H01L 21/50 (2006.01)
- H01L 21/4763 (2006.01)

(52) U.S. Cl. ......... 438/109; 438/106; 438/669; 438/623

(58) Field of Classification Search .................. 438/106, 438/109, 669, 670, 612, 613
See application file for complete search history.

(56) References Cited

U.S. PATENT DOCUMENTS

| | | | | |
|---|---|---|---|---|
| 3,660,726 | A * | 5/1972 | Ammon et al. | 174/262 |
| 3,761,782 | A | 9/1973 | Youmans | |
| 4,897,708 | A * | 1/1990 | Clements | 257/690 |
| 4,955,523 | A | 9/1990 | Calomagno et al. | |
| 5,229,647 | A | 7/1993 | Gnadinger | |
| 5,495,667 | A * | 3/1996 | Farnworth et al. | 29/843 |
| 5,781,415 | A * | 7/1998 | Itoh | 361/790 |
| 5,950,072 | A * | 9/1999 | Queyssac | 438/118 |
| 6,043,564 | A | 3/2000 | Brooks et al. | |
| 6,100,175 | A | 8/2000 | Wood et al. | |
| 6,114,187 | A * | 9/2000 | Hayes | 438/106 |
| 6,114,240 | A | 9/2000 | Akram | |
| 6,132,543 | A * | 10/2000 | Mohri et al. | 156/89.12 |
| 6,184,587 | B1 * | 2/2001 | Khandros et al. | 257/784 |
| 6,251,703 | B1 | 6/2001 | Van Campenhout et al. | |
| 6,294,837 | B1 | 9/2001 | Akram et al. | |

(Continued)

OTHER PUBLICATIONS

Naotaka Tanaka and Yoshihiro Yoshimira, "Ultra-thin 3D-Stacked SIP Formed Using Room-Temperature Bonding between Stacked Chips", 2005 Electronic Components and Technology Conference, pp. 788-794, May 31, 2005.

(Continued)

Primary Examiner — Chuong A. Luu
(74) Attorney, Agent, or Firm — Stephen A. Gratton

(57) ABSTRACT

A semiconductor component includes a carrier and multiple semiconductor substrates stacked and interconnected on the carrier. The carrier includes conductive members bonded to corresponding conductive openings on the semiconductor substrates. The component can also include terminal contacts on the carrier in electrical communication with the conductive members, and an outer member for protecting the semiconductor substrates. A method for fabricating the component includes the steps of providing the carrier with the conductive members, and providing the semiconductor substrates with the conductive openings. The method also includes the step of aligning and placing the conductive openings on the conductive members, and then bonding the conductive members to the conductive openings. A system includes the carrier having the conductive members, the semiconductor substrates having the conductive openings, an aligning and placing system for aligning and placing the semiconductor substrates on the carrier, and a bonding system for bonding the conductive members to the conductive openings.

12 Claims, 7 Drawing Sheets

U.S. PATENT DOCUMENTS

| | | | |
|---|---|---|---|
| 6,326,689 B1 | 12/2001 | Thomas | |
| 6,361,959 B1 * | 3/2002 | Beroz et al. | 435/14 |
| 6,569,762 B2 | 5/2003 | Kong | |
| 6,600,171 B1 | 7/2003 | Farnworth et al. | |
| 6,620,731 B1 | 9/2003 | Farnworth et al. | |
| 6,727,116 B2 * | 4/2004 | Poo et al. | 438/106 |
| 6,784,020 B2 * | 8/2004 | Lee et al. | 438/106 |
| 6,787,706 B2 | 9/2004 | Hirakawa | |
| 6,803,303 B1 | 10/2004 | Hiatt et al. | |
| 6,812,549 B2 | 11/2004 | Umetsu et al. | |
| 6,828,175 B2 | 12/2004 | Wood et al. | |
| 6,841,883 B1 | 1/2005 | Farnworth et al. | |
| 6,936,913 B2 | 8/2005 | Akerling et al. | |
| 6,943,056 B2 * | 9/2005 | Nemoto | 438/106 |
| 7,074,703 B2 * | 7/2006 | Fukazawa | 438/598 |
| 7,102,238 B2 | 9/2006 | Noma et al. | |
| 7,112,863 B2 | 9/2006 | Imaoka | |
| 7,132,731 B2 | 11/2006 | Wood et al. | |
| 7,170,153 B2 * | 1/2007 | Saga | 257/678 |
| 7,215,033 B2 | 5/2007 | Lee et al. | |
| 7,224,051 B2 | 5/2007 | Farnworth et al. | |
| 7,276,799 B2 | 10/2007 | Lee et al. | |
| 7,317,256 B2 | 1/2008 | Williams et al. | |
| 7,335,517 B2 * | 2/2008 | Hayasaka et al. | 438/4 |
| 7,371,676 B2 | 5/2008 | Hembree | |
| 7,382,060 B2 | 6/2008 | Farnworth et al. | |
| 7,388,294 B2 | 6/2008 | Klein et al. | |
| 7,393,770 B2 | 7/2008 | Wood et al. | |
| 7,417,325 B2 | 8/2008 | Farnworth et al. | |
| 7,432,600 B2 | 10/2008 | Klein et al. | |
| 7,473,582 B2 | 1/2009 | Wood et al. | |
| 7,476,963 B2 * | 1/2009 | Garth | 257/686 |
| 7,538,413 B2 | 5/2009 | Wood et al. | |
| 7,589,406 B2 | 9/2009 | Wood | |
| 7,786,605 B2 | 8/2010 | Wood et al. | |
| 7,833,832 B2 | 11/2010 | Wood et al. | |
| 7,919,846 B2 | 4/2011 | Hembree | |
| 7,935,991 B2 | 5/2011 | Wood et al. | |
| 7,951,702 B2 | 5/2011 | Wood et al. | |
| 7,964,946 B2 | 6/2011 | Kwang et al. | |
| 2002/0017710 A1 | 2/2002 | Kurashima et al. | |
| 2003/0107119 A1 * | 6/2003 | Kim | 257/686 |
| 2003/0230805 A1 | 12/2003 | Noma et al. | |
| 2004/0235270 A1 | 11/2004 | Noma et al. | |
| 2006/0289992 A1 | 12/2006 | Wood et al. | |
| 2007/0138498 A1 | 6/2007 | Zilber et al. | |

OTHER PUBLICATIONS

Hitachi and Renesas Technology Develop Thgrough-Hole Electrode Technology to Enable Interconnect of Stacked Chips at Room Temperature, press release, Jun. 1, 2005, pp. 1-2.

Onyx Series, AIR-VAC, Advantage brochure, Mar. 1, 2004, pp. 1-8.

IBM Research & IBM Systems and Technology Group C4NP Technology for lead-free wafer bumping, internet article, Sep. 2004, pp. 1-13.

Office Action dated Mar. 20, 2008 from U.S. Appl. No. 11/167,367, pp. 1-11.

Office Action dated Jul. 24, 2008 from U.S. Appl. No. 11/167,367, pp. 1-14.

Notice of Allowance dated Oct. 9, 2008 from U.S. Appl. No. 11/167,367, pp. 1-5.

* cited by examiner

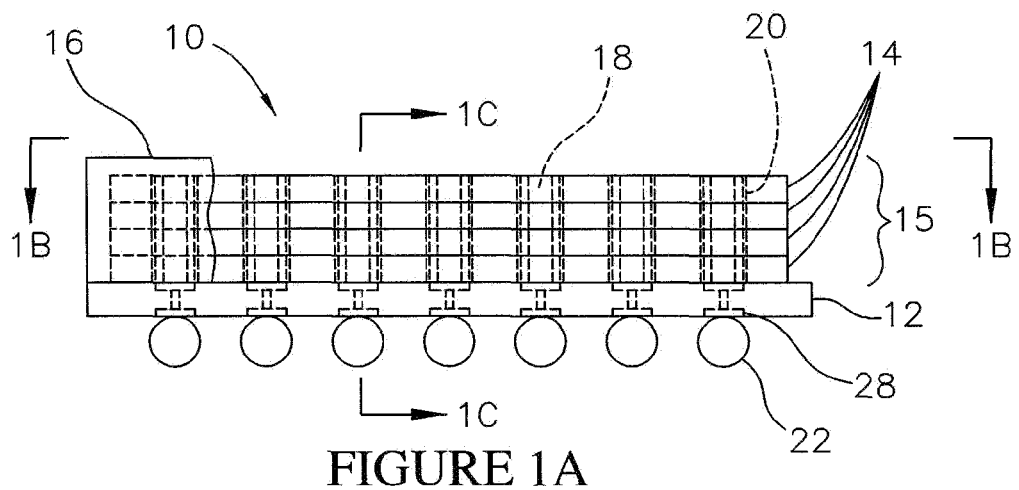
FIGURE 1A
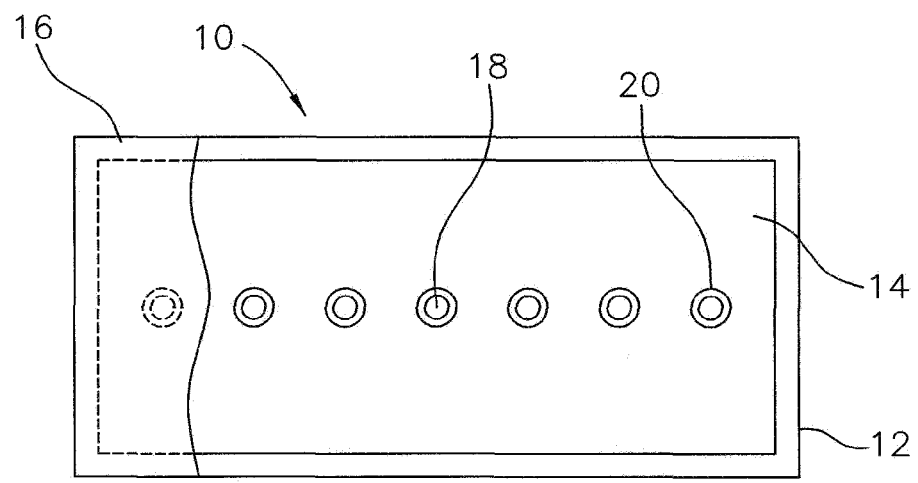
FIGURE 1B
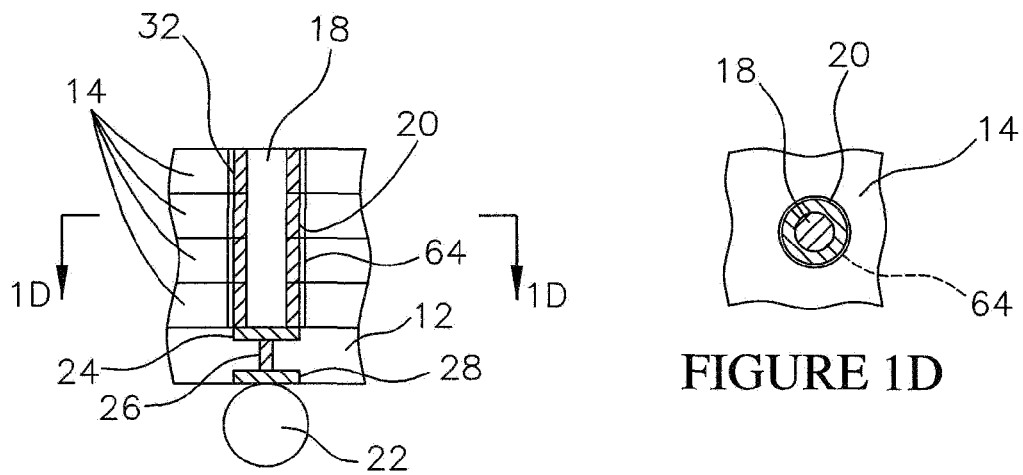
FIGURE 1C
FIGURE 1D

METHOD FOR FABRICATING STACKED SEMICONDUCTOR COMPONENTS

CROSS REFERENCE TO RELATED APPLICATIONS

This application is a division of Ser. No. 11/167,367 filed Jun. 27, 2005 now U.S. Pat. No. 7,589,406.

FIELD

This application relates generally to semiconductor packaging. More particularly, this application relates to a stacked semiconductor component, and to a method and system for fabricating the component.

BACKGROUND

Stacked semiconductor components can include multiple semiconductor substrates in a stacked array. The semiconductor substrates are typically in the form of semiconductor dice that have been singulated from a semiconductor wafer. In addition, the semiconductor substrates include integrated circuits in a desired electrical configuration, such as memory, processing or imaging. The stacked semiconductor substrates permit a component to be constructed as an integrated system, wherein each semiconductor substrate performs a different electrical function in the component (e.g., memory, processing, imaging etc.).

Semiconductor manufacturers have also developed components such as chip scale packages, having a smaller outline and a higher input/output capability than conventional components. Chip scale components have a peripheral outline (footprint) that is about the same as that of the semiconductor substrates contained in the components.

One aspect of chip scale components, is that they are difficult to manufacture with the reliability required in the industry. For example, some chip scale components include relatively complicated signal transmission systems, which are difficult to manufacture, and prone to failure. It would be advantageous for a stacked chip scale component to have a reliable signal transmission system capable of volume manufacture.

The present disclosure is directed to a semiconductor component having multiple stacked semiconductor substrates, and a reliable signal transmission system. The component can have a chip scale outline, or alternately can have a wafer sized outline. The present invention is also directed to a method and a system for fabricating the component.

SUMMARY

In accordance with the present disclosure, a stacked semiconductor component and a fabrication method for the component, are provided. Also provided are systems for fabricating the component.

The component includes a carrier and at least one semiconductor substrate on the carrier. In the illustrative embodiment multiple semiconductor substrates are stacked and interconnected on the carrier. The semiconductor substrates can comprise semiconductor dice, semiconductor packages, semiconductor wafers, or clusters of multiple semiconductor dice or packages. In addition, the semiconductor substrates are preferably thinned from the backside, such that the component has a reduced thickness or profile. The component also includes conductive members on the carrier bonded to corresponding conductive openings through the semiconductor substrates.

The conductive members form a signal transmission system for the component, and a support structure for holding and aligning the substrates on the carrier in a stacked array. In addition to being through openings, the conductive openings can be formed in substrate contacts, such as device bond pads or redistribution pads, in electrical communication with integrated circuits on the substrates. The component can also include terminal contacts on the carrier in electrical communication with the conductive members. In addition, the component can include an outer member, such as a polymer encapsulant, or a separate cover attached to the carrier, for protecting the semiconductor substrates. The component can be configured as a system in a package, a module or other electronic device. Alternately, the carrier can be used to test the substrates, which can then be removed from the carrier following testing. In this case, temporary electrical connections, rather than bonded electrical connections, can be formed between the conductive members and the conductive openings.

The method includes the steps of providing the carrier with the conductive members, and providing the semiconductor substrates with the conductive openings. The conductive members can be formed using a process such as screen printing, wire bonding, stud bumping, bumping using a dispensing mechanism, or bumping by transfer from a bump template. The conductive openings can be formed by at least partially covering insulated vias with a conductive material.

The method also includes the step of aligning and placing the conductive openings on the conductive members. The aligning and placing step can be performed using an automated system, such as a flip chip bonding system having a vision system. Alternately, the aligning and placing step can be performed using mechanical fixtures, or manually using a microscope. The method also includes the step of bonding the conductive members to the conductive openings. For performing the bonding step, either the conductive members or the conductive openings can include a bondable layer, such as solder, gold or a conductive polymer, bonded using thermal or microwave energy.

The system includes the carrier having the conductive members, and the semiconductor substrates having the conductive openings. In addition, the system includes an aligning and placing system for aligning and placing the semiconductor substrates on the carrier. The system also includes a bonding system for bonding the conductive members to the conductive openings. In addition, the system can include a molding system for forming the outer member on the stacked semiconductor substrates. The system can also include a wire bonding system, a dispensing system or a template bumping system for forming the conductive members on the carrier.

BRIEF DESCRIPTION OF THE DRAWINGS

FIG. 1A is an enlarged schematic side elevation view partially cut away of a stacked semiconductor component constructed in accordance with the invention;

FIG. 1B is an enlarged schematic view taken along line 1B-1B of FIG. 1A;

FIG. 1C is an enlarged schematic cross sectional view taken along section line 1C-1C of FIG. 1A;

FIG. 1D is an enlarged schematic cross sectional view taken along section line 1D-1D of FIG. 1C;

DETAILED DESCRIPTION OF THE PREFERRED EMBODIMENTS

Figure 2A:
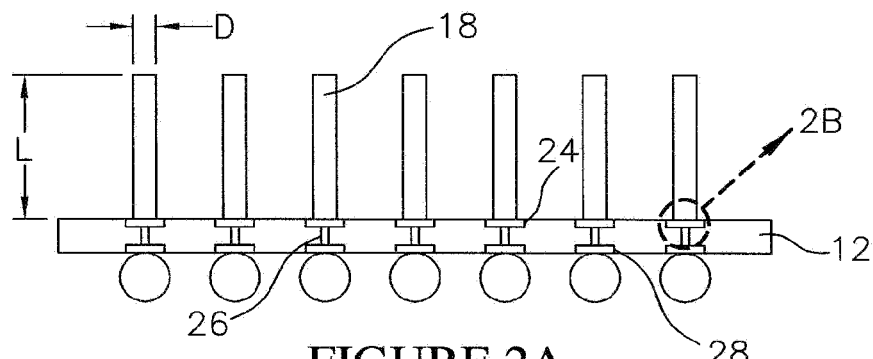
FIG. 2A is an enlarged schematic side elevation view of a carrier for the semiconductor component.
Figure 2B:
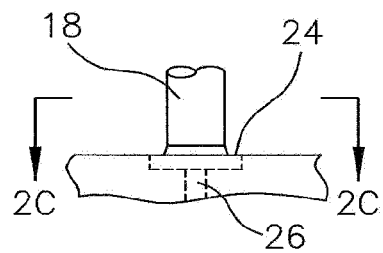
FIG. 2B is an enlarged portion of the carrier taken along line 2B of FIG. 2A.

As used herein, "semiconductor component" means an electronic element that includes a semiconductor substrate. "Semiconductor substrate" means an electronic element, such as a semiconductor die, or a semiconductor package that includes integrated circuits and semiconductor devices. "Wafer-level" means a process conducted on an element, such as a semiconductor wafer, containing multiple semiconductor substrates. "Die level" means a process conducted on a singulated element such as a singulated semiconductor die or package. "Chip scale" means having an outline about the same as that of a semiconductor die. "Wafer size" means having an outline about the same as that of a semiconductor wafer.

Referring to FIGS. 1A-1D, a semiconductor component 10 constructed in accordance with the invention is illustrated. The semiconductor component 10 includes a carrier 12, a plurality of semiconductor substrates 14 mounted and interconnected on the carrier 12 in a stacked array 15 (FIG. 1A), and an outer member 16 on the carrier 12 covering the semiconductor substrates 14. In the illustrative embodiment, there are four semiconductor substrates 14 in the stacked array 15. However, the semiconductor component 10 can contain just one semiconductor substrate 14, or any desired number of semiconductor substrates 14.

In the illustrative embodiment, the semiconductor substrates 14 are in the form of thinned semiconductor dice having a desired electrical configuration, such as dynamic random access memory (DRAM), static random access memory (SRAM), flash memory, microprocessor, digital signal processor (DSP), application specific integrated circuit (ASIC), or image sensing. However, the semiconductor substrates 14 can also be in the form of semiconductor packages, semiconductor wafers, or clusters of semiconductor dice or packages.

The semiconductor component 10 also includes a plurality of conductive members 18 on the carrier 12 configured to provide an interconnect system, and a support structure for the semiconductor substrates 12. The conductive members 18 on the carrier 12 are bonded to conductive openings 20 in the semiconductor substrates 12. The conductive openings 20 extend completely through the semiconductor substrate 12. In addition, the conductive openings 20 on the semiconductor substrates 12 align with one another along axes which are coincident to longitudinal axes of the conductive members 18. The semiconductor component 10 also includes a plurality of terminal contacts 22 on the carrier 12 in electrical communication with the conductive members 18.

Referring to FIGS. 2A-2D, the carrier 12 is illustrated separately. In the embodiment illustrated in FIGS. 2A-2D, the carrier 12 comprises a ceramic material. Alternately, as will be further explained, the carrier 12 can comprise a semiconductor material, such as silicon, provided with suitable electrically insulating layers. As another alternative, the carrier 12 can comprise an organic material, such as a polymer resin reinforced with glass fibers (e.g., bismaleimide-triazine (BT), epoxy resins, and polyimide resins).

The carrier 12 can have a desired peripheral shape, which preferably corresponds to, but is slightly larger (e.g., 1.2×) than, the peripheral shape of the semiconductor substrates 14. In the illustrative embodiments the carrier 12, and the semiconductor substrates 14, have a generally rectangular peripheral shape, but any polygonal shape can be utilized. In addition, all of the semiconductor substrates 14 have matching peripheral shapes, and are aligned with one another by the alignment of the conductive openings 20 on the conductive members 18.

Still referring to FIGS. 2A-2D, the carrier 12 also includes a plurality of carrier contacts 24 on which the conductive members 18 are formed. The carrier 12 also includes internal conductors 26 in electrical communication with the carrier contacts 24, and terminal contact pads 28 in electrical communication with the internal conductors 26. The carrier 12 also includes the terminal contacts 22 formed on the terminal contact pads 28.

Still referring to FIGS. 2A-2D, the carrier contacts 24 can comprise a metal such as tungsten, molybdenum or manganese formed using a screen printing process. Alternately, the carrier contacts 24 can comprise a bondable metal, such as aluminum or copper. As another alternative, the carrier contacts 24 can comprise a base layer of a metal, such as aluminum or copper plated with a bondable metal, such as Ni, Au, solder or a solder wettable metal. The number and pattern of the carrier contacts 24 matches the number and pattern of the conductive openings 20 on the semiconductor substrates 14. As shown in FIG. 1B, the carrier 12 is illustrated with seven carrier contacts 24 arranged in a single row along a center line thereof. However, in actual practice the carrier 12 can include tens of carrier contacts 24 arranged in a desired configuration, such as a center array, an edge array or an area array.

Still referring to FIGS. 2A-2D, the terminal contact pads 28 also preferably comprise a bondable metal such as those described for the carrier contacts 24. The terminal contacts 22 can comprise metal, solder, or conductive polymer balls, bumps or pins, formed using a metallization process, a stud bumping process or a ball bonding process. In addition, the terminal contacts 22 can be arranged in an area array, such as a ball grid array, a pin grid array, an edge array or a center array. In the illustrative embodiment, the terminal contacts 22 comprise balls having a selected diameter (e.g., 200 µm). A representative range for the diameter of the terminal contacts 22 can be from 60-500 µm.

Figure 2C:
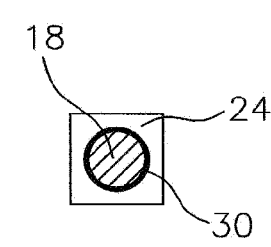
FIG. 2C is a cross sectional view of a conductive member on the carrier taken along section line 2C-2C of FIG. 2B.
Figure 2D:
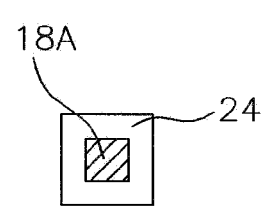
FIG. 2D is a cross sectional view equivalent to FIG. 2C of an alternate embodiment conductive member on the carrier.

As shown in FIG. 2A, the conductive members project from the surface of the carrier 12 with a selected length L. As shown in FIG. 2C, each conductive member 18 comprises a generally cylindrical shaped pin having a bonding layer 30 formed thereon. In the illustrative embodiment, each conductive member 18 includes a highly conductive, rigid core such as copper, tungsten, molybdenum, or manganese coated with a bonding layer 30, made of a bondable metal such as solder or gold. However, the conductive member 18 can also comprise a single metal, such as solder or gold without a bonding layer 30.

The conductive members 18 can comprise pins with a cylindrical shape, or the conductive members 18 can have other shapes and configurations. For example, the conductive members 18A (FIG. 2D) can have a polygonal shape, such as square or rectangular pillars. The length L (FIG. 2A) of the conductive members 18A can be selected as required, and can correspond to the combined thicknesses of the semiconductor substrates 14 (FIG. 1A). A representative range for the length L (FIG. 2A) of the conductive members 18 can be from 100-1000 µm. A representative range for the diameter D (FIG. 2A) of the conductive members 18 can be from 10 µm to 2 mils or greater.

As shown in FIG. 1A, each conductive member 18 is configured to physically and electrically engage each semiconductor substrate 14 of the stacked array 15. In addition, the conductive members 18 form a support structure that holds the semiconductor substrates 14 together in the stacked array 15. In this regard, the conductive members 18 are similar to metal reinforcing material in a concrete structure. The support structure provided by the conductive members 18 holds and aligns the semiconductor substrates 14 on the carrier 12, and allows the stacked component 10 to be tested prior to the encapsulating step.

In addition to providing a support structure and a signal transmission system and as shown in FIG. 1B, the tip portions of the conductive members 18 are exposed, and provide planar connection points for making temporary electrical connections for testing a single semiconductor substrate 14 or multiple semiconductor substrates 14 in a stack. As such, the carrier 12 and the conductive members 18 can be used as a test fixture for applying test signals to the semiconductor substrates 14, which can be removed following testing. Further, the conductive members 18 can be spaced apart with a larger pitch than the substrate contacts 38 (FIG. 3A), such that electrical engagement by a testing apparatus is facilitated.

In the embodiment illustrated in FIG. 2A, the carrier 12 comprises an electrically insulating ceramic material, and the conductive members 18 are formed using a screen printing process. Ceramic substrates with screen printed metal layers having a desired geometry can be obtained from Kyocera Corporation of Kyoto, Japan. In this case, suitable materials for the carrier 12 include sintered aluminum oxide, mullite, silicon nitride, aluminum nitride, or silicon carbide. In addition, the conductive members 18 can comprise a high melting point metal, such as tungsten, molybdenum or manganese, coated with the bonding layer 30. The carrier contacts 24, the internal conductors 26 and the terminal contact pads 28 can also comprise a high melting point metal coated with additional layers if required. U.S. Pat. No. 6,787,706 B2, assigned to Kyocera Corporation, which is incorporated herein by reference, describes representative processes for fabricating ceramic substrates with screen printed metal layers.

Alternately, as will be further explained, the conductive members 18 (FIG. 2B) can be formed on the carrier contacts 24 using a bonding process, such as ultrasonic wire bonding, thermosonic wire bonding, thermocompression wire bonding, or conductive polymer bonding. As another alternative, the conductive members 18 can be formed on the carrier contacts 24, using a bumping process, such as bumping using a dispensing mechanism or bumping by transfer from a bump template. These alternate embodiment processes for forming the conductive members 18 (FIG. 2B) will be further described as the description proceeds.

Still referring to FIG. 2C, the bonding layer 30 can comprise a bondable material configured to form bonded connections 32 (FIG. 1C) between the conductive members 18 and the conductive openings 20 (FIG. 1C) in the semiconductor substrates 14 (FIG. 1C). Suitable materials for the bonding layer 30 include solder, gold, platinum, and conductive polymers. The bonding layer 30 can be formed using a suitable deposition process such as electroless deposition, electrolytic deposition, dipping, and CVD. As an alternative to forming the bonding layers 30 on the conductive members 18, the bonding layers 30 can be formed on the conductive openings 34 (FIG. 3B). As another alternative, the bonded connections 32 can be formed by depositing a viscous material, such as solder or a conductive polymer, into the conductive openings 20, and then cooling or curing the material.

Figure 3A:
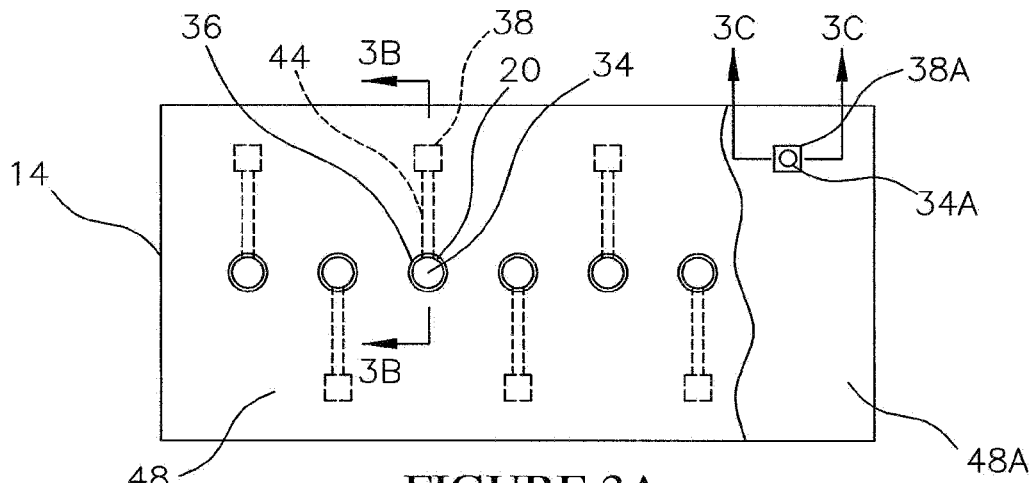
FIG. 3A is an enlarged schematic plan view of a semiconductor substrate of the semiconductor component with an alternate embodiment substrate shown on the right.
Figure 3B:
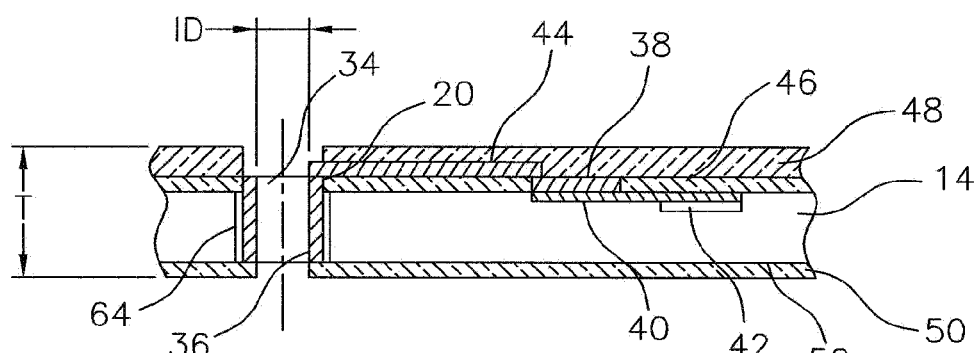
FIG. 3B is an enlarged schematic cross sectional view of the semiconductor substrate taken along section line 3B-3B of FIG. 3A.

Referring to FIGS. 3A-3B, a semiconductor substrate 14 is illustrated separately. The semiconductor substrate 14 includes the conductive openings 20, which are configured for bonding to the conductive members 18 (FIG. 2A) on the carrier 12 (FIG. 2A). Each conductive member 18 includes an opening 34 (FIG. 3B) through the semiconductor substrate 14 (FIG. 3B), and a conductive material 36 (FIG. 3B) on the sidewalls of the opening 34 (FIG. 3B). The conductive members 18 can be formed within the boundaries of the semiconductor substrate 14 substantially as shown in FIG. 3A. Alternately, with the substrate 14 contained on a wafer, the conductive members 18 can be located in the streets of the wafer between adjacent semiconductor substrates 14.

The openings 34 (FIG. 3B) can be formed using an etching process such as a dry etching process or a wet etching process. U.S. Pat. No. 6,841,883 B1 to Farnworth et al., and U.S. Pat. No. 6,908,784 to Farnworth et al., which are incorporated herein by reference, disclose etching processes for forming the openings 34 (FIG. 3B). The openings 34 (FIG. 3B) can also be formed using a laser machining process, such as described in U.S. Pat. No. 6,620,731 B1, to Farnworth et al.; U.S. Pat. No. 6,114,240 to Akram et al.; and U.S. Pat. No. 6,828,175 B2 to Wood et al.; all of which are incorporated herein by reference. The laser machining process can also include a wet etching step to remove contaminants and slag.

Each conductive member 18 (FIG. 3B) also includes an insulating layer 64 (FIG. 3B) in the opening 34 (FIG. 3B), which electrically insulates the conductive material 36 from the bulk of the semiconductor substrate 14 (FIG. 3B). The insulating layer 64 (FIG. 3B) can be a deposited polymer, such as polyimide or parylene, formed using a suitable deposition process, such as vapor deposition. Alternately, the insulating layer 64 (FIG. 3B) can comprise a material, such as silicon dioxide formed by an oxidation process. Each of the cited patents from the preceding paragraph disclose methods for forming the insulating layer 64 (FIG. 3B).

The conductive material 36 (FIG. 3B) for each conductive member 18 (FIG. 3B) can comprise a highly conductive bondable metal, such as copper, solder, nickel, gold, or aluminum. In addition, the conductive material 36 (FIG. 3B) can be deposited on the sidewalls of the opening 34 using a deposition process, such as electroless deposition, electrolytic deposition, or CVD. A thickness of the conductive material 36 (FIG. 3B) can be selected as required, with from 5 to 50 μm being representative. In addition, an inside diameter ID (FIG. 3B) of the conductive openings 20 (FIG. 3B) can be approximately equal to but slightly larger than, the diameter D (FIG. 2A) of the conductive members 18. Preferably, the conductive openings 20 having an inside diameter ID which is at least several microns greater than the diameter D (FIG. 2A) of the conductive members 18. Alternately, the conductive openings 20 can have an inside diameter that is less than the outside diameter of the conductive members 18, and the conductive members 18 can include a deformable material such as a conductive polymer coating. In this case the conductive members 18 can be press fitted into the conductive openings 20.

Still referring to FIGS. 3A-3B, the semiconductor substrate 14 also includes a plurality of device contacts 38, such as bond pads or redistribution pads, formed of a material such as aluminum, copper or alloys of these metals. As shown in FIG. 3A, the device contacts 38 can comprise generally square planar pads having a desired size and spacing. As shown in FIG. 3B, the semiconductor substrate 14 also includes internal conductors 40 and integrated circuits 42 in electrical communication with the device contacts 38. The internal conductors 40 and the integrated circuits can comprise conventional elements formed using materials and techniques that are known in the art.

The semiconductor substrate 14 (FIG. 3B) also includes redistribution conductors 44 (FIG. 3B) on a circuit side 46 (FIG. 3B) thereof, in electrical communication with the device contacts 38 (FIG. 3B) and with the conductive material 36 (FIG. 3B) for the conductive openings 20 (FIG. 3B). The redistribution conductors 44 (FIG. 3B) can comprise a highly conductive metal, such as copper or aluminum, formed using a suitable process such as electroless deposition, CVD, PECVD, PVD, or sputtering.

The semiconductor substrate 14 (FIG. 3B) also includes a circuit side insulating layer 48 formed on the circuit side 46, and a back side insulating layer 50 formed on a back side 52 thereof. The circuit side insulating layer 48 and the back side insulating layer 50 can comprise a polymer such as polyimide or parylene, or a glass, such as borophosphate silicate glass (BPSG), formed using a suitable deposition process. As also shown in FIG. 3B, the semiconductor substrate 14 can have a selected thickness T. Preferably, the semiconductor substrate 14 comprises a thinned semiconductor die, with a reduced thickness T. A representative value for the thickness T (FIG. 3B) can be from 10 μm to 725 μm.

The semiconductor substrate 14 can be thinned using a suitable process such as chemical mechanical planarization (CMP). One suitable CMP apparatus is manufactured by "ACCRETECH" of Tokyo, Japan, and is designated a model no. "PG300RM". Suitable CMP apparatus are also commercially available from Westech, SEZ, Plasma Polishing Systems, TRUSI and other manufacturers. Alternately, thinning can be performed using an etching process, such as a wet etching process, a dry etching process or a plasma etching process. As another alternative, a combination of planarization and etching can be performed. For example, a mechanical grinder can be used to remove the bulk of the material, followed by etching to remove grind damage. Previously incorporated U.S. Pat. No. 6,841,883 B1, further describes processes and equipment for thinning the semiconductor substrate 14.

Figure 3C:
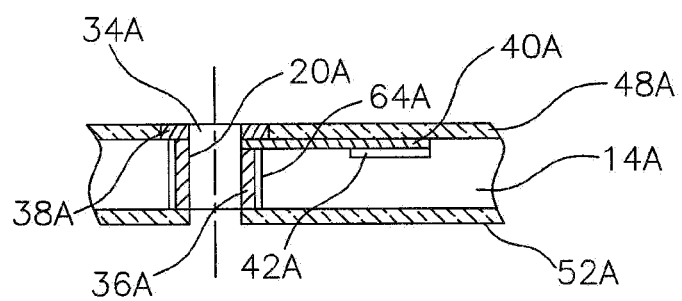
FIG. 3C is an enlarged schematic cross sectional view taken along section line 3C-3C of FIG. 3A illustrating the alternate embodiment semiconductor substrate.

Referring to FIG. 3C, an alternate embodiment semiconductor substrate 14A is substantially similar to the semiconductor substrate 14 (FIG. 3B). However, the semiconductor substrate 14A includes conductive openings 20A which are formed through the semiconductor substrate 14A, and through device contacts 38A as well. The device contacts 38A can comprise bond pads, or redistribution pads, in electrical communication with integrated circuits 42A.

As shown in FIG. 3C, each conductive opening 20A includes an opening 34A which extends through a device contact 38A and through the semiconductor substrate 14A to the back side thereof. Each conductive opening 20A also includes a conductive material 36A on the sidewalls of the opening 34A, and an insulating layer 64A, substantially as previously described for the opening 34 (FIG. 3B), the conductive material 36 (FIG. 3B) and insulating layer 64 (FIG. 3B). In addition, an internal conductor 40A directly connects the conductive material 36A to the integrated circuits 42A in the semiconductor substrate 14A. The semiconductor substrate 14A also includes a circuit side insulating layer 48A, and a back side insulating layer 52A, formed substantially as previously described for the circuit side insulating layer 48 (FIG. 3B) and the back side insulating layer 50 (FIG. 3B). The openings 34A can be formed using an etching process, a laser machining process or a combination of these processes. Previously incorporated U.S. Pat. No. 6,828,175 B2, discloses methods for forming the openings 34A through the device contacts 38A and the semiconductor substrate 14A. As another alternative, the device contacts 38A can be fabricated with the openings 34A therein, which can then be extended through the substrate 14A by etching or laser machining.

Figure 4A:
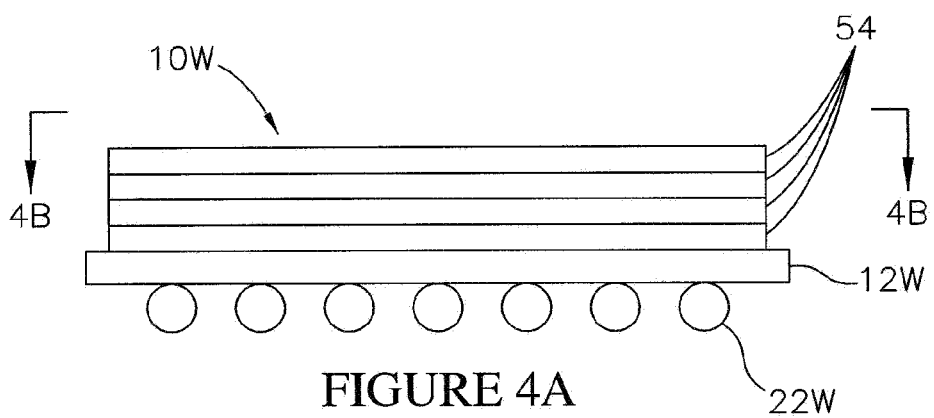
FIG. 4A is an enlarged schematic side elevation view of an alternate embodiment wafer sized semiconductor component.
Figure 4B:
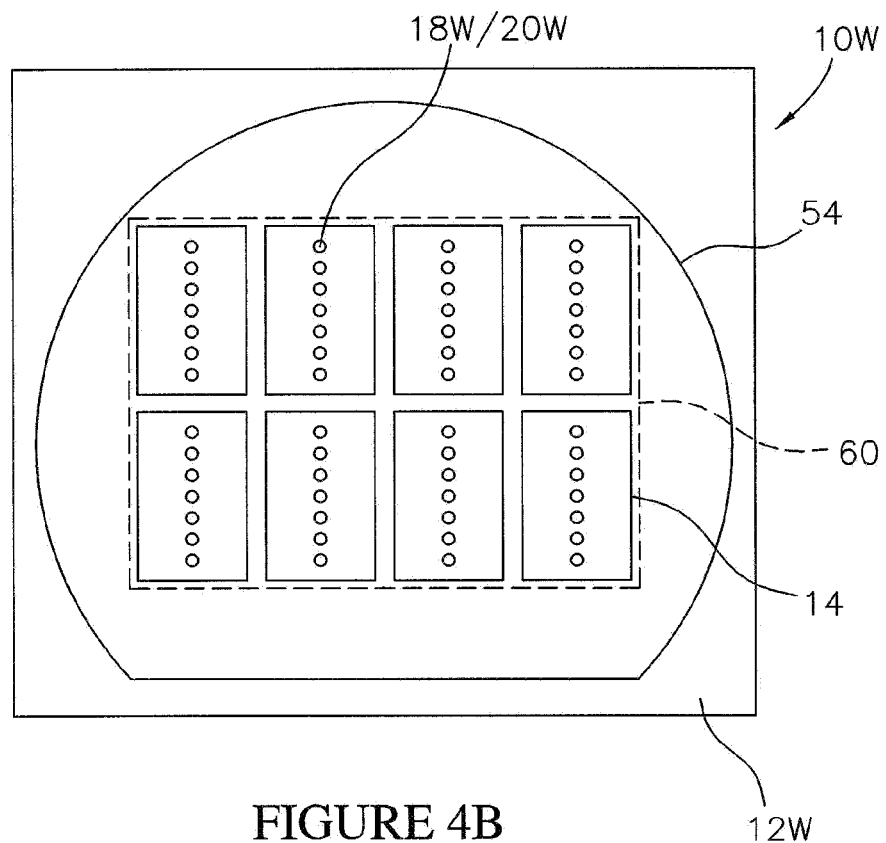
FIG. 4B is an enlarged schematic view taken along line 4B-4B of FIG. 4A.

Referring to FIGS. 4A-4B, an alternate embodiment semiconductor component 10W is illustrated. The semiconductor component 10W is substantially similar to the semiconductor component 10 (FIG. 1A), but includes semiconductor wafers 54, rather than singulated semiconductor substrates 14. In addition, the semiconductor component 10W includes a carrier 12W with terminal contacts 22W configured substantially as previously described for carrier 12 (FIG. 1A) but with a wafer scale configuration. Further, the carrier 12W includes conductive members 18W (FIG. 4B) that mate with conductive openings 20W (FIG. 4B) on the semiconductor wafers 54.

As also shown in FIG. 4B, the semiconductor component 10W, rather than being constructed of complete semiconductor wafers 54, can include clusters 60 of multiple semiconductor substrates 14. Also, the semiconductor component 10W could be singulated using a process, such as sawing, scribing, liquid jetting, or laser cutting through a liquid, such that the semiconductor substrates 14 on the wafers 54 form individual components 10 (FIG. 1A).

Figure 5A:
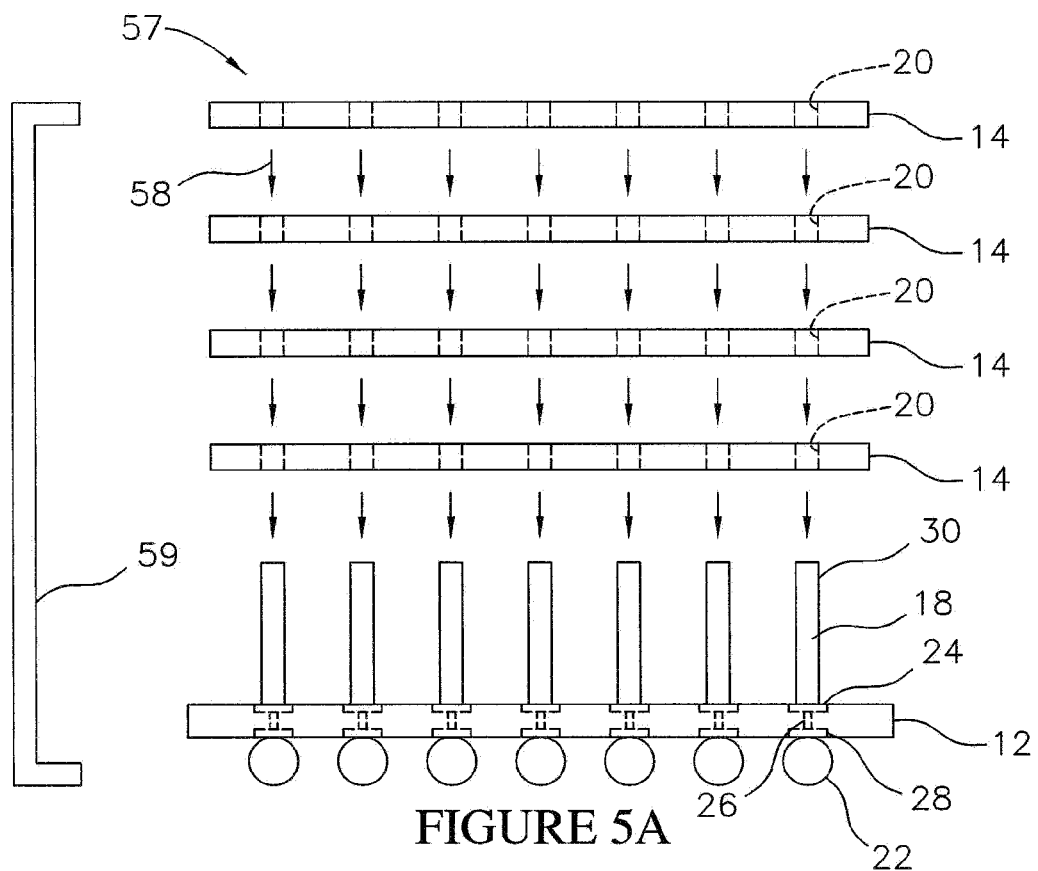
FIG. 5A is an enlarged schematic view illustrating an aligning and placing step in the method for fabricating the semiconductor component.
Figure 5B:
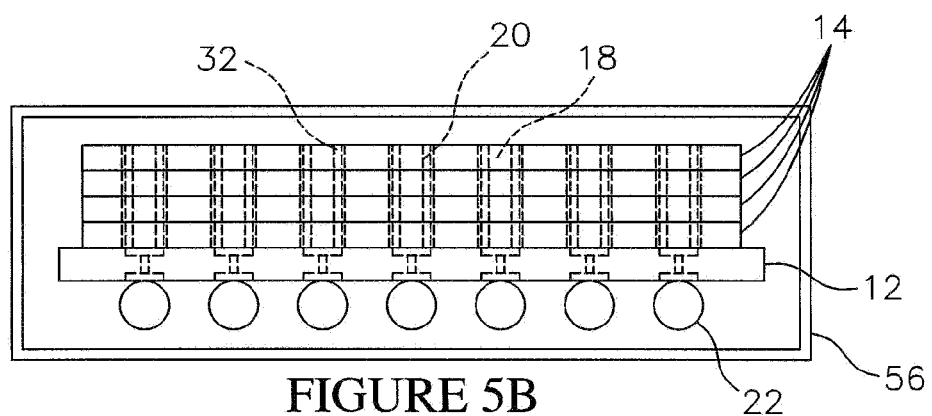
FIG. 5B is an enlarged schematic elevation view illustrating a bonding step in the method.
Figure 5C:
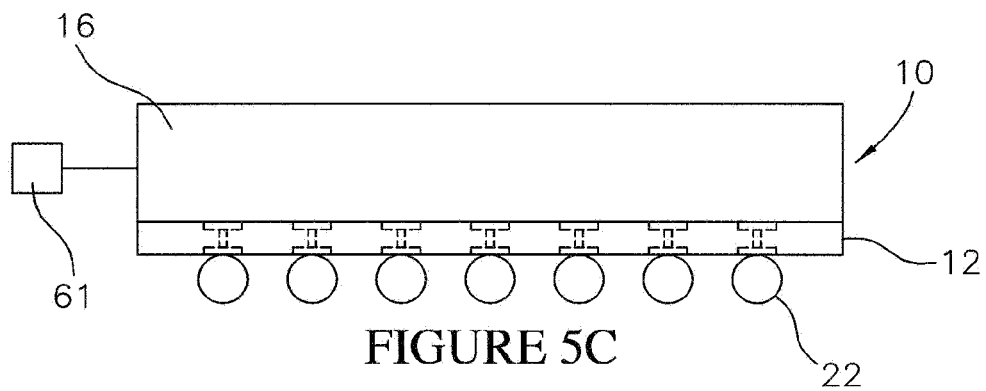
FIG. 5C is an enlarged schematic view illustrating an encapsulating step in the method.

Referring to FIGS. 5A-5C, steps in the method of invention, and components of a system 57 for performing the method, are illustrated. Initially, as shown in FIG. 5A, the carrier 12 and the semiconductor substrates 14 are provided with all of the previously described features. Preferably, the semiconductor substrates 14 are contained on a semiconductor wafer 54 (FIG. 4B), and a wafer level fabrication process is performed. However, for simplicity in FIGS. 5A-5C, singulated semiconductor substrates 14 are illustrated. In addition, the semiconductor substrates 14 can be tested and burned in, such that they are provided as known good dice (KGD). In this case the conductive openings 20 can be used to provide large pitch contact points for performing the test procedures.

As also shown in FIG. 5A, an aligning and placing step is performed in which the semiconductor substrates 14 are aligned and individually placed on the carrier 12. The semiconductor substrates 14 are aligned such that the conductive openings 20 on adjacent semiconductor substrates 14 align with one another, and with the conductive members 18 on the carrier 12. In addition, the semiconductor substrates 14 are placed on the carrier 12, such that the conductive members 18 physically contact and extend through the conductive openings 20. Alignment and placement of the semiconductor substrates 14 can be performed using an aligning and placing system 59 having optical alignment capabilities. One suitable aligning and placing system 59 comprises a "Flip Chip Wafer System", Model No. 2200 APM, manufactured by Datacon Technology Gmbh, of Radfeld, Austria. Alternately, the alignment and placing step can be performed using alignment fixtures, or manually using a microscope.

Next, as shown in FIG. 5B, a bonding step is performed in which the bonding layers 30 on the conductive members 18 are bonded to the conductive material 36 (FIG. 3B) on the conductive openings 20 to form the bonded connections 32. The bonding step can be performed thermally using an oven 56 or other heating system. In addition, the aligning and placing system and the bonding system can be incorporated in a single system. One suitable system comprises an automated "ONYX29" robotic system manufactured by Air-Vac Products of Seymour Conn.

During the bonding step, the conductive members 18 can be heated to a temperature sufficient to melt the bonding layer 30 and form the bonded connections 32 between the conductive members 18 and the conductive openings 20. Alternately, the bonding step can be performed with microwave energy using a variable frequency microwave (VFM) system. Alternately the bonding step can be performed using ultrasonic energy rather than thermal energy, or can be performed using a curing process. Also, prior to the bonding step, and depending on the sizes of the conductive members 18 and the conductive openings 20, either the conductive openings 20 or the conductive members 18 can be coated with a low temperature conductive polymer, such that there is sufficient contact between the conductive members 18 and the conductive openings 20 to form the bonded connections 32. For example, the bonding layers 30 can comprise a low temperature conductive polymer able to deform into the conductive openings 20 in the manner of a press fit. Following the bonding step, the stacked substrates 14 can be tested and burned in if required, with the conductive openings 20 and the conductive members 18 providing large pitch electrical connection points for testing.

Next, as shown in FIG. 5C, an encapsulating step is performed in which the outer member 16 is formed on the carrier 12. The outer member 16 can comprise a molded material, such as a molded epoxy, that encapsulates the semiconductor substrates 14. In this case, the outer member 16 can be formed using a molding system 61 and techniques that are known in the art. Alternately, the outer member 16 can comprise a separate member, such as a cover, that is attached to the carrier 12. As another alternative, the outer member 16 can comprise a deposited polymer, such as a glob top polymer.

Figure 6:
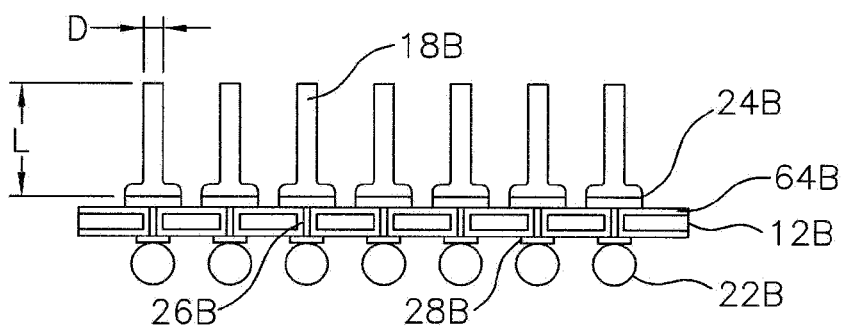
FIG. 6 is an enlarged schematic side elevation view of an alternate embodiment carrier.

Referring to FIG. 6, an alternate embodiment carrier 12B includes conductive members 18B formed by a bonding process, such as wire bonding or stud bumping. In addition, the carrier 12B is formed of a semiconductor material, such as silicon, having insulating layers 64B formed on opposing sides and circumjacent to internal conductors 26B, substantially as previously described for insulating layers 64 (FIG. 1C). The carrier 12B also includes terminal contacts 22B on terminal contact pads 28B, substantially as previously described for terminal contacts 22 (FIG. 1A) and terminal contact pads 28 (FIG. 1A). The carrier 12B also includes carrier contacts 24B on which the conductive members 18B are formed. All of the elements of the carrier 12B can be formed using conventional semiconductor processes, such as insulating and metallization processes. For example, U.S. Pat. No. 6,294,837 B1 to Akram et al., which is incorporated herein by reference, discloses methods for forming an interconnect out of a semiconductor material, such as silicon.

Figure 7A:
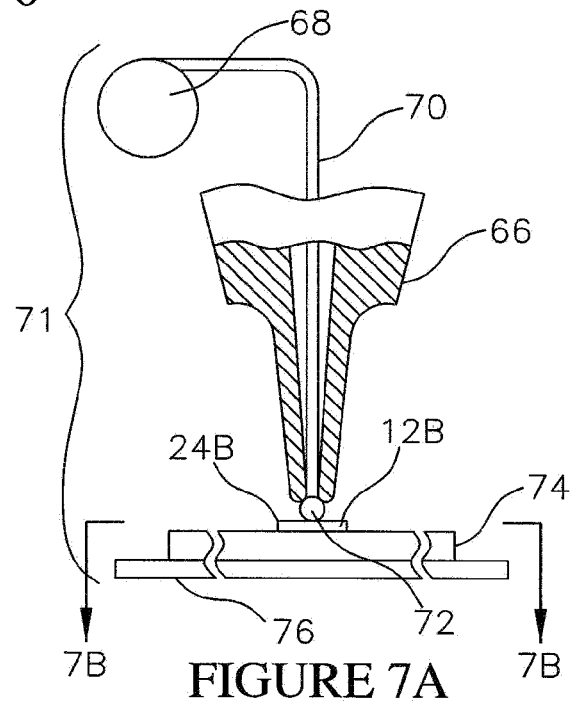
FIG. 7A is an enlarged schematic side elevation view illustrating a step in a method for fabricating the alternate embodiment carrier of FIG. 6.
Figure 7B:
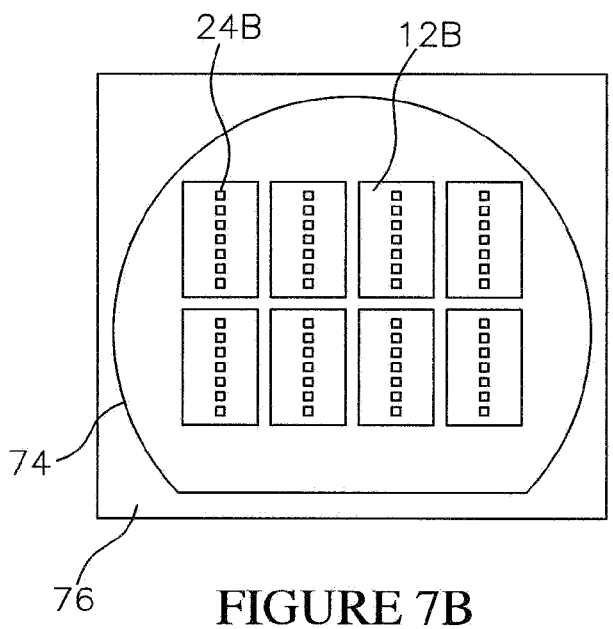
FIG. 7B is a schematic view taken along line 7B-7B of FIG. 7A.

Referring to FIGS. 7A and 7B, steps in a method for fabricating the conductive members 18B are illustrated. As shown in FIG. 7B, the carrier 12B can initially be contained on a wafer 74, such as a blank semiconductor wafer. In addition, the wafer 74 can be held in a temporary carrier 76 (FIG. 7B). For example, a temporary carrier 76 made of glass can be fused/bonded by heat and adhesives to the wafer 74. Suitable, temporary carriers are manufactured by 3-M Corporation of St. Paul, Minn., and others as well. In addition, to holding the wafer 74 for forming the conductive members 18B, the temporary carrier 76 can be used in subsequent steps, such as the aligning and placing step of FIG. 5A, and the bonding step of FIG. 5B.

As shown in FIG. 7A, a wire bonding system 71 includes a bonding tool 66 and a wire feed mechanism 68. The wire bonding system 71 can be configured to perform a bonding step in which wire bonds 72 are formed on the carrier contacts 24B using a wire 70 having a selected diameter D (FIG. 6). In addition, the bonding tool 66 is configured to sever the wire 70 to form the conductive members 18B (FIG. 6) with a selected length L (FIG. 6). In the embodiment illustrated in FIG. 7A, the bonding step comprises a wire bonding process. However, the wire bonding step can also comprise a stud bumping process, or a wedge bonding process, such as a gold or aluminum wedge bonding process.

Kulicke & Soffa Industries Inc. of Willow Grove, Pa. manufactures bonding systems 71 for performing the wire bonding step. For example, a model "8098" large area ball bonder manufactured by Kulicke & Soffa has a total bond placement accuracy of about +/−5 µm at pitches down to about 65 µm. A suitable stud bumper for performing the wire bonding step is a "WAFER PRO PLUS" high speed large area stud bumper manufactured by Kulicke & Soffa Industries, Inc. Wire bonding systems are also available from ESEC (USA), Inc., Phoenix, Ariz.; Palomar Technologies, Vista, Calif.; Shinkawa USA, Inc., Santa Clara, Calif.; ASM from Products Inc., San Jose, Calif.; Kaijo from Texmac Inc., Santa Clara, Calif.; and Muhibauer High Tech, Newport News, Va.

Figure 8:
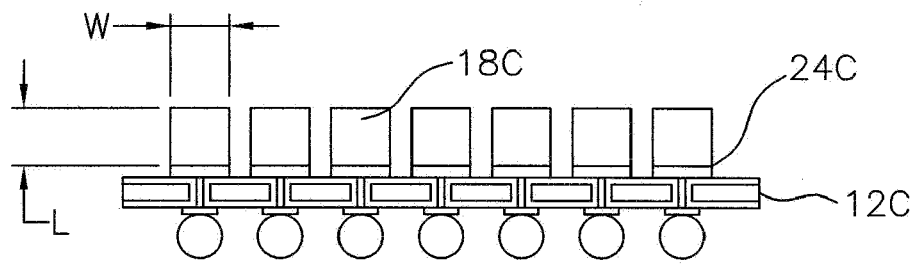
FIG. 8 is an enlarged schematic side elevation view of an alternate embodiment carrier.
Figure 9A:
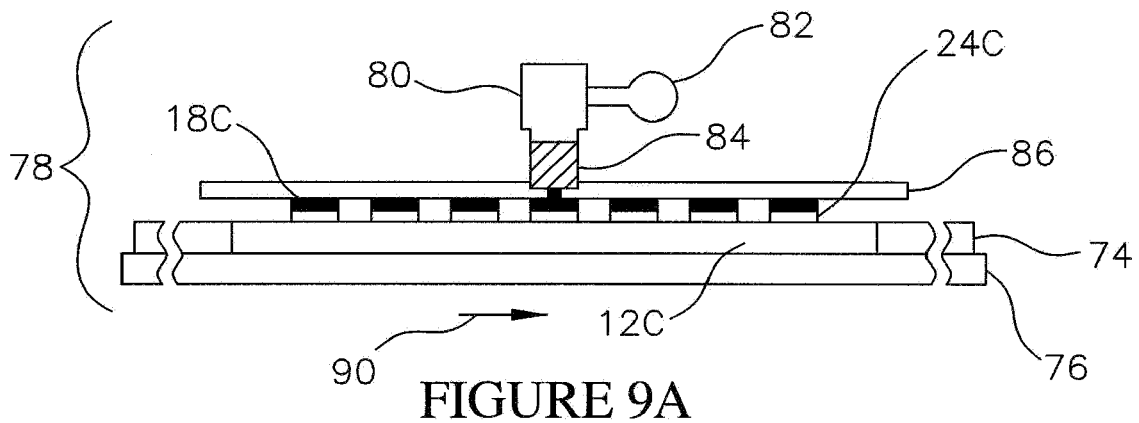
FIG. 9A is an enlarged schematic side elevation view illustrating a step in a method for fabricating the alternate embodiment carrier of FIG. 8 using a bonding system.

Referring to FIG. 8, an alternate embodiment carrier 12C includes conductive members 18C formed by a deposition process using a dispensing bumping system 78 (FIG. 9A). The carrier 12C is substantially similar to the carrier 12B (FIG. 6), and includes carrier contacts 24C on which the conductive members 18C are formed. In addition, elements of the dispensing bumping system 78 (FIG. 9A) are commercially available from SUSS MicroTec AG of Munchen, Germany under license from IBM (International Business Machines) of East Fishkill, N.Y. These components are marketed as "Technology for lead-free wafer bumping" under the trademark "C4NP".

Figure 9B:
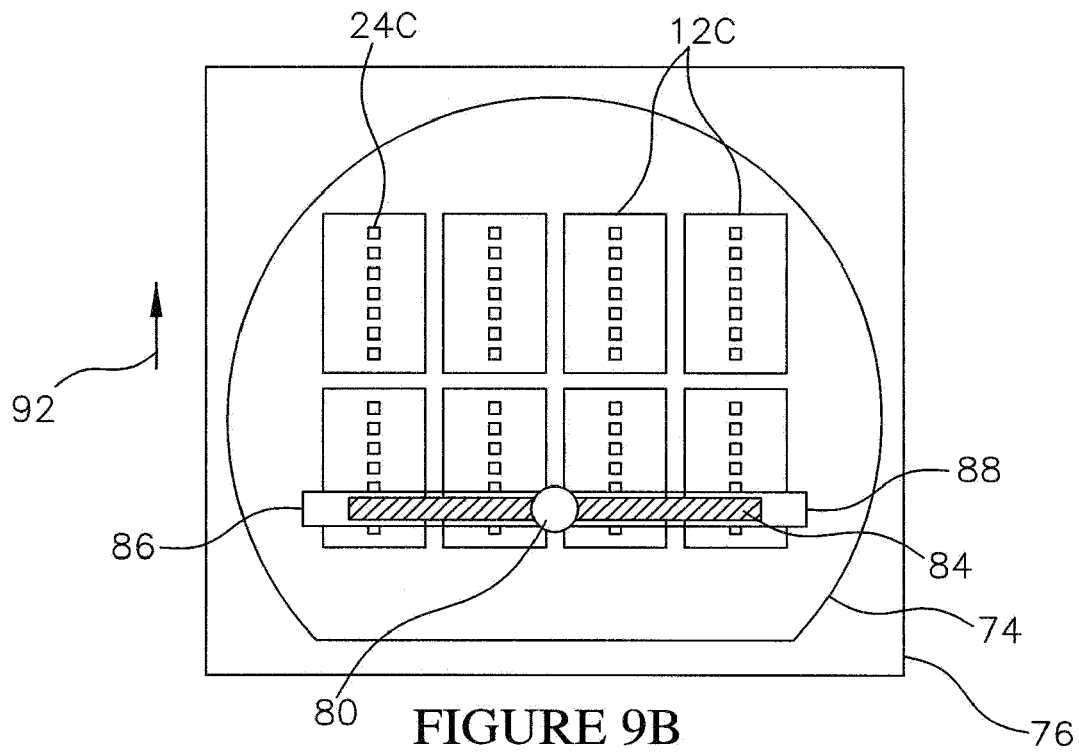
FIG. 9B is a schematic view taken along line 9B-9B of FIG. 8.

Referring to FIGS. 9A and 9B, steps in a method for fabricating the conductive members 18C (FIG. 8) are illustrated. As shown in FIG. 9B, the carrier 12C can initially be contained on the wafer 74 and held in the temporary carrier 76 as previously described. In addition, the dispensing bumping system 78 includes a dispensing mechanism 80 in flow communication with a pressure source 82 (FIG. 9A). The dispensing mechanism 80 is a stationary element configured to hold a quantity of solder 84 in a viscous state. Preferably, the solder 84 comprises a lead free solder. The dispensing mechanism 80 includes a head element 86 having a solder slot 88 (FIG. 9B) configured to dispense the solder 84 onto the carrier contacts 24C as the wafer 74 is moved in scan directions 90, 92. The head element 86 and the solder slot 88 (FIG. 9B) are also configured to planarize the conductive members 18C.

Figure 10:
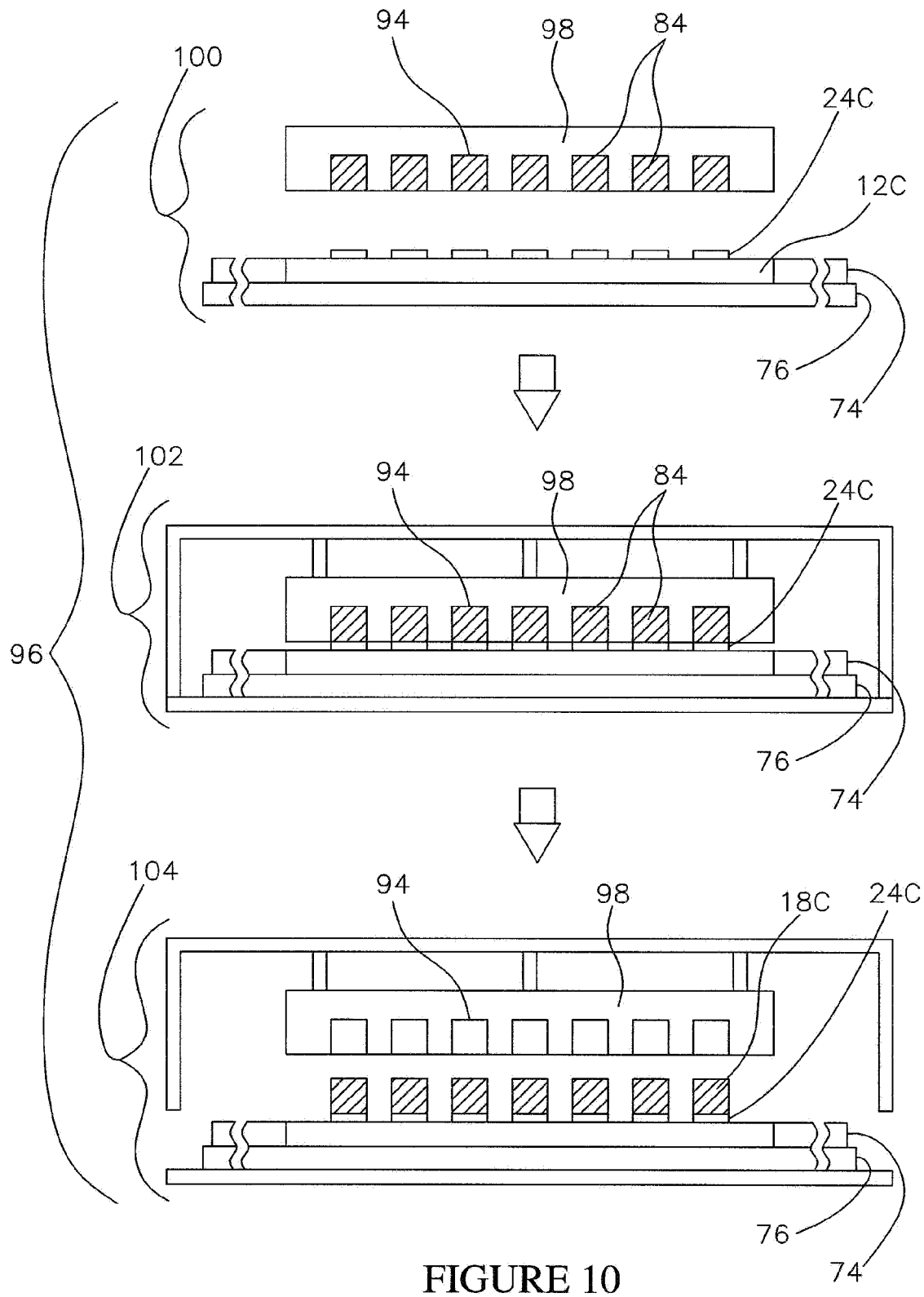
FIG. 10 is a schematic view illustrating steps in a method for fabricating the alternate embodiment carrier of FIG. 8 using a template bumping system.

Referring to FIG. 10, steps in a method for fabricating the conductive members 18C using a template bumping system 96 are illustrated. As with the dispensing bumping system 78, components of the template bumping system 96, are commercially available from IBM (International Business Machines) of East Fishkill, N.Y. and SUSS MicroTec AG of Munchen, Germany. These components are marketed as "Technology for lead-free wafer bumping" under the trademark "C4NP".

The template bumping system 96 includes a bump template 98 having cavities 94 configured to hold solder 84. The cavities 94 correspond in size, shape and location to the conductive members 18C. The template bumping system 96 also includes the dispensing mechanism 80 (FIG. 9A) configured to dispense the solder 84 into the cavities 94, substantially as previously described. The template bumping system 96 includes flux and alignment components 100 configured to apply flux to carrier contacts 24C, and to align the cavities 94 to the carrier contacts 24C. The template bumping system 96 also includes clamping and reflow components 102 configured to clamp the bump template 98 to the wafer 74, and to transfer the solder 84 onto the carrier contacts 24C. The template bumping system 96 also includes a separation component 104 configured to separate the bump template 98 from the wafer 74, leaving the conductive members 18C Thus the invention provides a stacked semiconductor component, and a method and a system for fabricating the component. While the invention has been described with reference to certain preferred embodiments, as will be apparent to those skilled in the art, certain changes and modifications can be made without departing from the scope of the invention as defined by the following claims.

What is claimed is:

1. A method for fabricating a semiconductor component comprising:
   providing a carrier;
   forming a plurality of conductive members on the carrier with a length L and a width W using a dispensing mechanism configured to dispense solder through a slot or into a bump template;
   providing a plurality of semiconductor substrates, each substrate comprising a thinned semiconductor die or package having a plurality of integrated circuits in a desired electrical configuration and a plurality of conductive openings in electrical communication with the integrated circuits, each conductive opening comprising an opening through the substrate having a conductive material covering a sidewall of the opening;
   aligning the conductive members with the conductive openings;
   bonding the conductive members to the conductive openings by heating the conductive members to a temperature sufficient to melt the solder and form bonded connections.

2. The method of claim 1 wherein the aligning and placing step, and the bonding step are performed using a flip chip bonding system.

3. The method of claim 1 wherein the solder comprises s lead free solder.

4. The method of claim 1 wherein the aligning and placing step and the bonding step are performed using an automated robotic system.

5. The method of claim 1 wherein each semiconductor substrate comprises a device selected from the group consisting of dynamic access memory (DRAM), static random access memory (SRAM), flash memory, microprocessor, digital signal processor (DSP), application specific integrated circuit (ASIC) and imaging sensing.

6. The method of claim 1 further comprising forming a plurality of terminal contacts on the carrier in electrical communication with the conductive members.

7. A method for fabricating a semiconductor component comprising;
   providing a plurality of semiconductor substrates, each substrate comprising a plurality of integrated circuits in a desired electrical configuration, and a plurality of substrate contacts comprising device bond pads or redistribution pads in electrical communication with the substrate contacts;
   thinning each substrate to a selected thickness T;
   forming a plurality of conductive openings through the substrates and the substrate contacts in electrical communication with the integrated circuits, each conductive opening comprising an opening through the substrate and a substrate contact and a conductive material covering a sidewall of the opening;
   providing a carrier;
   forming a plurality of conductive members on the carrier configured to physically and electrically engage the conductive openings by screen printing each conductive member with a desired geometry and a bonding layer comprising a bondable material;
   aligning the conductive members to the conductive openings and placing the substrates on the carrier in a stacked array with the conductive members in the conductive openings supporting the stacked array and forming a signal transmission system for electrically interconnecting the substrates; and
   bonding the conductive members to the conductive material on the conductive openings by heating the conductive members to a temperature sufficient to melt the bondable material and form bonded connections.

8. The method of claim 7 wherein the thinning step comprises a process selected from the group consisting of chemical mechanical planarization (CMP), etching, and grinding.

9. The method of claim 8 wherein each conductive member has a length L of from 100 μm to 1000 μm.

10. The method of claim 7 further comprising attaching a separate cover to the carrier encapsulating the substrates.

11. The method of claim 10 wherein the substrates have a desired electrical configuration and the signal transmission system interconnects the substrates as a system in a package or a module.

12. The method of claim 11 wherein each semiconductor substrate comprises a device selected from the group consisting of dynamic access memory (DRAM), static random access memory (SRAM), flash memory, microprocessor, digital signal processor (DSP), application specific integrated circuit (ASIC) and imaging sensing.

* * * * *

UNITED STATES PATENT AND TRADEMARK OFFICE
CERTIFICATE OF CORRECTION

| | | |
|---|---|---|
| PATENT NO. | : 8,258,006 B2 | Page 1 of 1 |
| APPLICATION NO. | : 12/265032 | |
| DATED | : September 4, 2012 | |
| INVENTOR(S) | : Alan G. Wood | |

It is certified that error appears in the above-identified patent and that said Letters Patent is hereby corrected as shown below:

In column 12, line 4, in Claim 3, delete "s" and insert -- a --, therefor.

Signed and Sealed this
Thirteenth Day of November, 2012

David J. Kappos
*Director of the United States Patent and Trademark Office*